SEMICONDUCTOR ELEMENT WITH IMPROVED GUARD REGION

Filed Dec. 4, 1967

United States Patent Office 3,538,398
Patented Nov. 3, 1970

3,538,398
SEMICONDUCTOR ELEMENT WITH IMPROVED GUARD REGION

Gerald Whiting, London, England, assignor to Westinghouse Brake and Signal Company, Limited, London, England Filed Dec. 4, 1967, Ser. No. 687,662
Claims priority, application Great Britain, Jan. 26, 1967, 3,879/67
Int. Cl. H01l 5/00
U.S. Cl. 317—235 1 Claim

ABSTRACT OF THE DISCLOSURE

A semiconductor element having a first region of a first type of conductivity and a second region of an opposite type of conductivity, which regions define therebetween a first P-N junction terminating peripherally in a surface of the element, is provided with an additional region of the first type of conductivity which forms a guard junction. The guard region is segmented and is located adjacent portions of the P-N junction at which, but for the presence of the guard region, the element would be most susceptible to surface breakdown.

Figure 1:
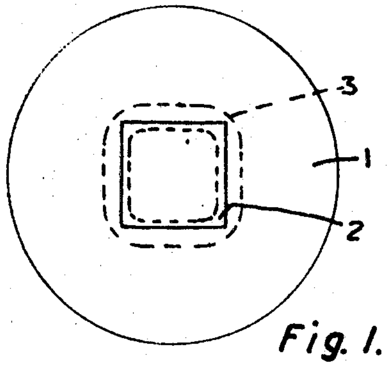

This invention relates to semi-conductor elements.

The present invention provides a semi-conductor element having a first region of one type of conductivity and a second region of the opposite type of conductivity, which regions define between them a first P-N junction which terminates peripherally in a surface of the element and an additional region of said one type of conductivity defining with the second region a guard junction. The additional region is spaced from the first junction such that, in operation, the depletion layer in the second region attendant the first junction merges with the depletion layer in the second region attendant the guard junction upon the application of a potential difference across the first junction of a value which is less than the value of potential difference necessary to cause surface breakdown of the first junction but for the presence of the guard junction. The additional region extends part way only around the first junction and is located relative to the first junction adjacent a part thereof at which, but for the guard junction, the element would, in operation, be most susceptible to surface breakdown.

There may be provided a plurality of such additional regions which collectively do not extend wholly around the first junction and are located relative to the first junction adjacent those parts of the first junction most susceptible to surface breakdown. Where the first junction includes portions of small radius of curvature as compared to the remainder of the first junction, such an additional region may be located adjacent each of these portions. The or each additional region may be constituted by a plurality of discrete zones of said one type of conductivity.

The terminal periphery of the first junction may form a rectangle on the surface of the element and in such a case there may be provided four such additional regions one at each corner of the junction. In this case, each such additional region may have two arms, one arm extending, part way only, down each of the two sides of a rectangle forming the respective corner.

The terminal periphery of the first junction may form on said surface a cruciform configuration. With such an arrangement four additional regions may be provided, one located within each pair of arms of the cruciform. In this case, the four additional regions may each provide a guard junction in the form of a rectangle terminating peripherally on the surface of the element.

Alternatively, the terminal periphery of the first junction may form on said surface a configuration in the form of a rectangle the corners of which are chamfered. Again, in this case, four additional regions may be provided, one located at each chamfered corner of the rectangle and each one of the four additional regions may terminate peripherally on said surface in a triangle.

In another form, the first junction may terminate peripherally on said surface in a circle and the additional regions may then each be arcuate and centered about the circular terminal periphery of the first junction.

Embodiments of the present invention will now be described in greater detail by way of example, with reference to the accompanying drawings of which:

FIG. 1 schematically illustrates in plan view a conventional semi-conductor embodiment and the form of depletion region normally associated therewith.

Figure 4:
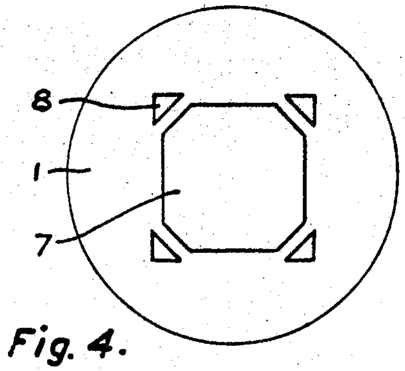
Figure 5:
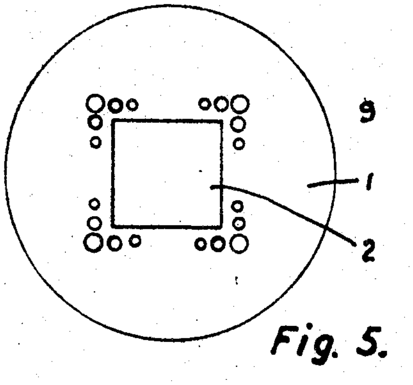
Figure 6:
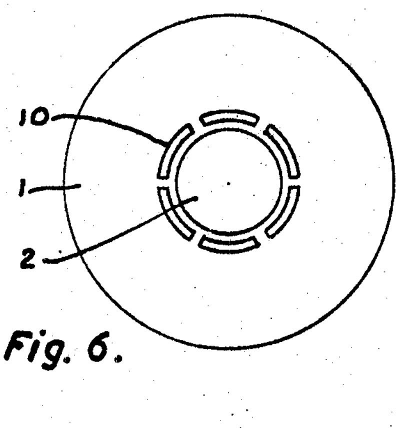

FIG. 2 to FIG. 5 similarly illustrate embodiments derived from that of FIG. 1 in accordance with the first mentioned form of the invention, and FIG. 6 schematically illustrates in plan view an embodiment in accordance with the second mentioned form of the invention.

The device of FIG. 1 comprises an element 1 in the form of a wafer of semi-conducting material of one conductivity type, say, N-type, having a P-type conductivity region 2 of square section formed substantially perpendicularly in a major surface thereof, and the material of element 1 being of higher resistivity than that of the region 2. It can be shown that the depletion region normally associated with the junction defined between the element 1 and region 2 presents in the element surface a configuration as indicated in broken line at 3. The particular feature of this configuration which is undesirable in practice is that it does not uniformly follow the square junction, but rather it cuts the corners as it were.

This depletion region could be extended wholly protected therearound by use of an annular guard junction but it is disadvantageous to do so simply to extend the corner parts of such regions if the remaining parts thereof are otherwise satisfactory. This depletion region could be protected by the use of an annular guard junction extending wholly therearound but this approach is disadvantageous in that it may, for example, be necessary only to extend the corner portions of such a region in that the remaining portions of the region are satisfactory. Where a guard region is utilized which extends wholly around the depletion region the total length of the junction periphery will be significantly increased relative to the actual length necessary and this increase in length will be accompanied by an equally significant risk in the junction passing through a flaw in the element and of the likely incidence of junction periphery contamination.

Figure 2:
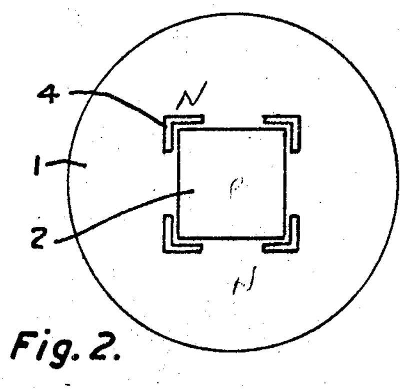

FIG. 2 illustrates an embodiment according to the invention in its first form whereby the above difficulty with FIG. 1 is reduced. This is effected by use of additional regions 4 of the P-type conductivity of right-angled form disposed one adjacent each corner of the region 2, and serving to provide guard junctions which selectively extend the normal depletion region.

This form of the invention is, of course, not limited to the embodiment of FIG. 2 and the additional regions can take various forms not only in association with corresponding variations in the relevant first junction form but also relative to a given form for the latter. Again, the first junction configuration may itself be modified, from that which would otherwise be employed, to accommodate advantageous additional regions.

Figure 3:
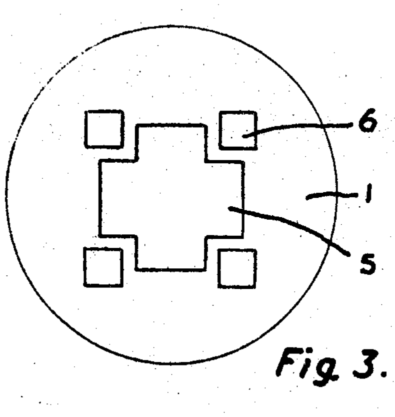

Thus, FIG. 3 illustrates another embodiment in which the original square region 2 is modified to a cruciform configuration 5 to accommodate additional regions 6 of square form. In FIG. 4, the first region 7 is of generally square form but with chamfered corners to accommodate additional regions 8 of triangular form.

FIG. 5 illustrates an embodiment employing a plurality of additional regions 9 of circular form disposed in succession around each corner of the square region 2.

In its second form the invention effectively extends the concept of the regions 9 in FIG. 5 in using a succession of additional regions where a single such region contributing a longer junction periphery might otherwise be used. This concept of a segmented guard junction can be applied where it is desired to extend a normal depletion region uniformly therearound, such as may be the case with a first junction of circular form, for example. FIG. 6 illustrates an embodiment employing a segmented annular guard junction of this type provided by additional regions 10.

It is, of course, to be understood that the present invention may make use of suitable manufacturing techniques and other appropriate features previously proposed in connection with annular guard junctions. Moreover, the present invention may be employed in association with annular guard junctions where it is desired to extend a depletion region wholly therearound but in non-uniform manner. In any event, while it is probably unnecessary to elaborate these last comments for the purposes of persons skilled in the semi-conductor devices art, it is noted that a more detailed discussion of annular guard junctions is given in British Pat. No. 1,138,237.

Having thus described my invention, what I claim is:

1. A semi-conductor element comprising a first region of one type of conductivity and a second region of the opposite type of conductivity, a first P-N junction defined by said first and second regions terminating in the surface of the element in a closed line configuration including at least one discontinuity therein more susceptible to surface breakdown than the remainder of the surface terminating configuration, an additional region of said one type of conductivity located in said second region of said opposite type of conductivity and spaced from said first region of said one type of conductivity, and a guard region defined by said second region and said additional region terminating in the surface of the element, positioned outward of said P-N junction and adjacent said discontinuity in said P-N junction so as to constitute means for protecting said discontinuity, and extending partially around said P-N junction only in the area of said discontinuity.

References Cited

UNITED STATES PATENTS

| | | | |
|---|---|---|---|
| 3,226,612 | 12/1965 | Haenichen | 317—234 |
| 3,226,613 | 12/1965 | Haenichen | 317—234 |
| 3,226,614 | 12/1965 | Haenichen | 317—234 |
| 3,309,245 | 3/1967 | Haenichen | 148—187 |
| 3,394,037 | 7/1968 | Robinson | 148—187 |
| 3,226,611 | 12/1965 | Haenichen | 317—234 |
| 3,338,758 | 8/1967 | Tremere | 148—335 |
| 3,271,640 | 9/1966 | Moore | 317—235 |
| 3,335,296 | 8/1967 | Smart | 307—88.5 |
| 3,391,287 | 7/1968 | Kao et al. | 307—302 |

JOHN W. HUCKERT, Primary Examiner

B. ESTRIN, Assistant Examiner

U.S. Cl. X.R.

317—234